(12) United States Patent
Lucas et al.

(10) Patent No.: US 8,971,048 B2
(45) Date of Patent: Mar. 3, 2015

(54) SELF-LOCATING ELECTRONICS PACKAGE PRECURSOR STRUCTURE, METHOD FOR CONFIGURING AN ELECTRONICS PACKAGE, AND ELECTRONICS PACKAGE

(71) Applicant: Alliant Techsystems Inc., Arlington, VA (US)

(72) Inventors: James D. Lucas, Chanhassen, MN (US); Christopher A. McKellips, Albertville, MN (US)

(73) Assignee: Alliant Techsystems Inc., Arlington, VA (US)

( * ) Notice: Subject to any disclaimer, the term of this patent is extended or adjusted under 35 U.S.C. 154(b) by 95 days.

(21) Appl. No.: 13/787,438

(22) Filed: Mar. 6, 2013

(65) Prior Publication Data

US 2014/0254109 A1 Sep. 11, 2014

(51) Int. Cl.
H05K 1/00 (2006.01)
H05K 1/14 (2006.01)
H05K 3/46 (2006.01)

(52) U.S. Cl.
CPC ............... *H05K 1/148* (2013.01); *H05K 1/144* (2013.01); *H05K 3/4691* (2013.01); *H05K 2201/042* (2013.01); *H05K 2201/046* (2013.01); *H05K 2201/047* (2013.01); *H05K 2201/053* (2013.01); *H05K 2201/2036* (2013.01)
USPC ......................................... 361/749; 361/748

(58) Field of Classification Search
USPC ................................................. 361/749, 748
See application file for complete search history.

(56) References Cited

U.S. PATENT DOCUMENTS

| | | | |
|---|---|---|---|
| 3,676,746 A * | 7/1972 | Kassabgi et al. ............... | 361/796 |
| 6,167,809 B1 | 1/2001 | Robinson | |
| 6,431,071 B1 | 8/2002 | Hodge et al. | |
| 7,444,937 B2 | 11/2008 | Magnan et al. | |
| 7,490,553 B2 | 2/2009 | Magnan et al. | |
| 8,276,515 B1 | 10/2012 | Robinson et al. | |
| 8,342,717 B1 | 1/2013 | Livesay et al. | |
| 2010/0008034 A1 | 1/2010 | Hinkle | |
| 2013/0008334 A1 | 1/2013 | Claridge et al. | |
| 2013/0328543 A1 | 12/2013 | Chen et al. | |
| 2014/0160683 A1* | 6/2014 | Snider et al. ................... | 361/709 |

FOREIGN PATENT DOCUMENTS

| | | | |
|---|---|---|---|
| DE | 10 2007 046 493 A1 | | 4/2009 |
| DE | 10 2008 025 938 A1 | | 12/2009 |

(Continued)

OTHER PUBLICATIONS

PCT International Search Report, ISA/EP, International Application No. PCT/US2014/017274, Oct. 24, 2014, five (5) pages.

(Continued)

*Primary Examiner* — Andargie M Aychillhum
(74) *Attorney, Agent, or Firm* — TraskBritt (57) ABSTRACT

An electronics package comprising a plurality of mutually parallel, vertically spaced circuit boards of generally circular configuration and electrically connected by a flex circuit comprising a trunk extending circumferentially around the circuit boards and having a branch extending to each circuit board. An electronics package precursor structure and a method of configuring the electronics package from the precursor structure is also disclosed.

16 Claims, 7 Drawing Sheets

(56) References Cited

FOREIGN PATENT DOCUMENTS

| | | | |
|---|---|---|---|
| DE | 20 2011 003 115 U1 | 6/2011 |
| DE | 20 2012 006 289 U1 | 11/2012 |
| GB | 2488422 B | 8/2012 |

OTHER PUBLICATIONS

Written Opinion of the International Searching Authority, ISA/EP, International Application No. PCT/US2014/017274, Oct. 24, 2014, six (6) pages.

* cited by examiner

SELF-LOCATING ELECTRONICS PACKAGE PRECURSOR STRUCTURE, METHOD FOR CONFIGURING AN ELECTRONICS PACKAGE, AND ELECTRONICS PACKAGE

TECHNICAL FIELD

Embodiments of the present disclosure relate to packaging of electronic components and methods of assembly of such packaging. More particularly, embodiments of the present disclosure relate to packaging employing a self-locating electronics package precursor structure, a method of producing an electronics package, and an electronics package which may be suited for miniaturized applications including, without limitation, application to electronic safe and arm assemblies for munitions.

BACKGROUND

As with other electronics applications, electronics for self-propelled munitions has trended toward miniaturization. Reductions in mass and volume of fuze assemblies, including without limitation so-called "safe and arm" assemblies, consequently enable a larger mass and volume of one or more of explosive, propellant, and other electronics (e.g., communication and guidance system), for a volume available for a self-propelled projectile. Use of solid state electronics has increased both sophistication of function and reliability of safe and arm assemblies, but presents challenges in packaging in terms of required mechanical support structure and inter-component wiring, as well as in assembly of such packaging. Conventional packaging for such applications may be of unacceptable size and require specialized components and structural features which add weight and complexity without enhancing functionality.

BRIEF SUMMARY

In some embodiments, the present disclosure comprises an electronics package, the electronics package comprising a number of mutually parallel, vertically spaced circuit boards and a flex circuit comprising a trunk extending circumferentially and including a same number of branches as the number of circuit boards, each branch mechanically and electrically connected to one of the number of circuit boards.

In other embodiments, the present disclosure comprises an electronics package precursor structure, the precursor structure including a flex circuit having a linear trunk, a first pair of opposing branches extending perpendicular to the trunk, each branch of the first pair mechanically and electrically connected to a generally circular circuit board, and a second pair of opposing branches extending perpendicular to the trunk, each branch of the second pair mechanically and electrically connected to a generally circular circuit board. In further embodiments the present disclosure comprises a method of producing an electronics package, the method comprising providing a generally planar assembly comprising a flex circuit including a linear trunk, a first pair of opposing branches extending perpendicular to the trunk, each branch of the first pair mechanically and electrically connected to a generally circular circuit board and a second pair of opposing branches extending perpendicular to the trunk, each branch of the second pair mechanically and electrically connected to a generally circular circuit board, moving circuit boards connected to the first pair of branches toward one another to a position perpendicular to the plane of the assembly and rotating the circuit boards connected to the first pair of branches along an axis of the linear trunk to a position between the second pair of branches, and moving circuit boards connected to the second pair of branches toward one another to a position perpendicular to the plane of the assembly and on opposing sides of the circuit boards connected to the first pair of branches to place all of the circuit boards in aligned, mutually parallel relationship.

DETAILED DESCRIPTION

The illustrations presented herein are not actual views of any particular electronics package, but are merely idealized representations that are employed to describe embodiments of the present disclosure.

Figure 1:
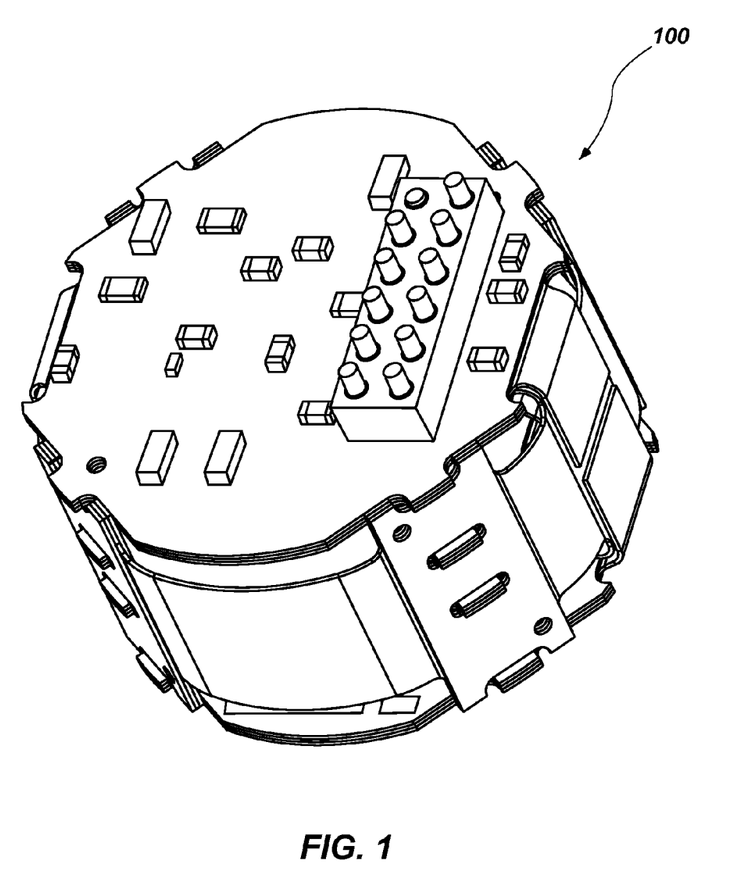
FIG. 1 is a perspective view of an embodiment of an electronics package of the present disclosure including installed active and passive electronic components.
Figure 2:
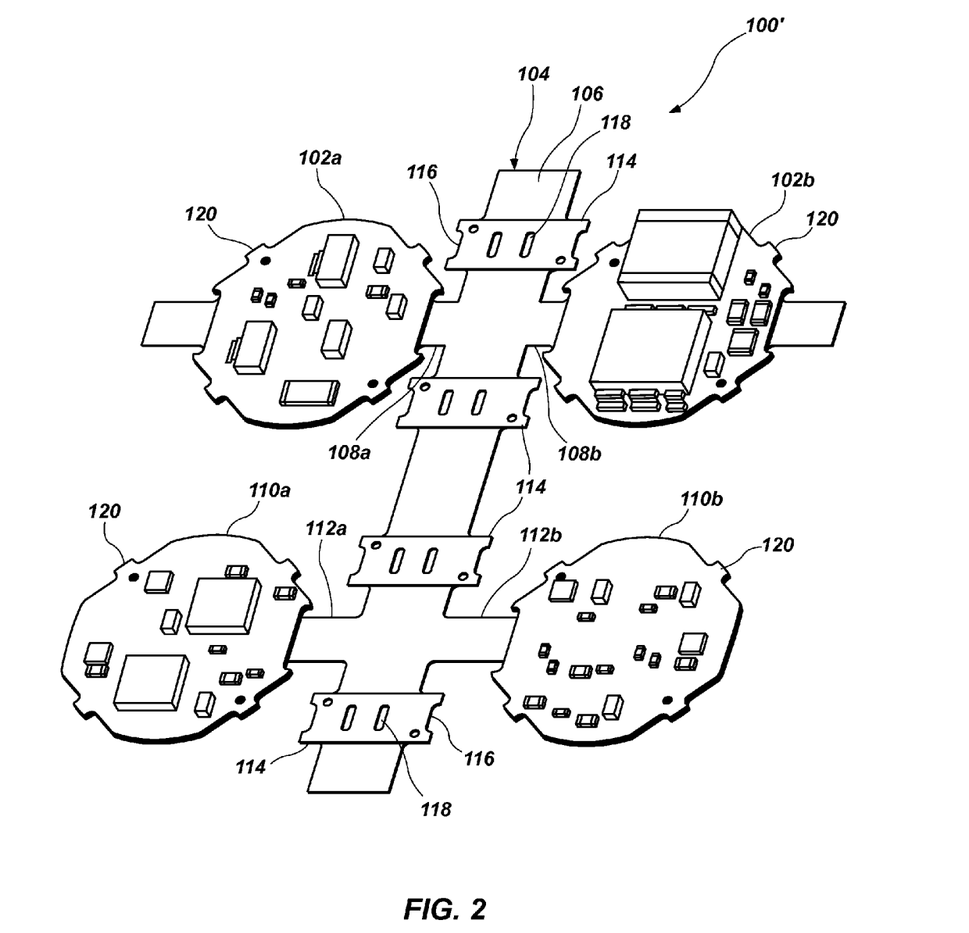
FIG. 2 is a perspective view of a precursor structure of the electronics package of the present disclosure including installed active and passive electronic components prior to configuration as the electronics package.

Referring now to FIGS. 1 and 2, an embodiment of an electronics package 100 according to the present disclosure is depicted, respectively, in perspective and as an unconfigured precursor structure 100'. Active and passive electronic components, unnumbered, are depicted for purposes of illustration only, and not by way of limitation. Electronics package 100 comprises a number of circuit boards bearing one or more levels of circuit traces for connection of electronic components thereto, and mechanically and electrically connected to circuit traces of a multi-arm flex circuit, to which a number of baffles are secured. Circuit traces are not depicted for clarity of illustration of the disclosure, and because the number, type and routing of circuit traces are not material to implementation of embodiments of the disclosure.

Figure 3:
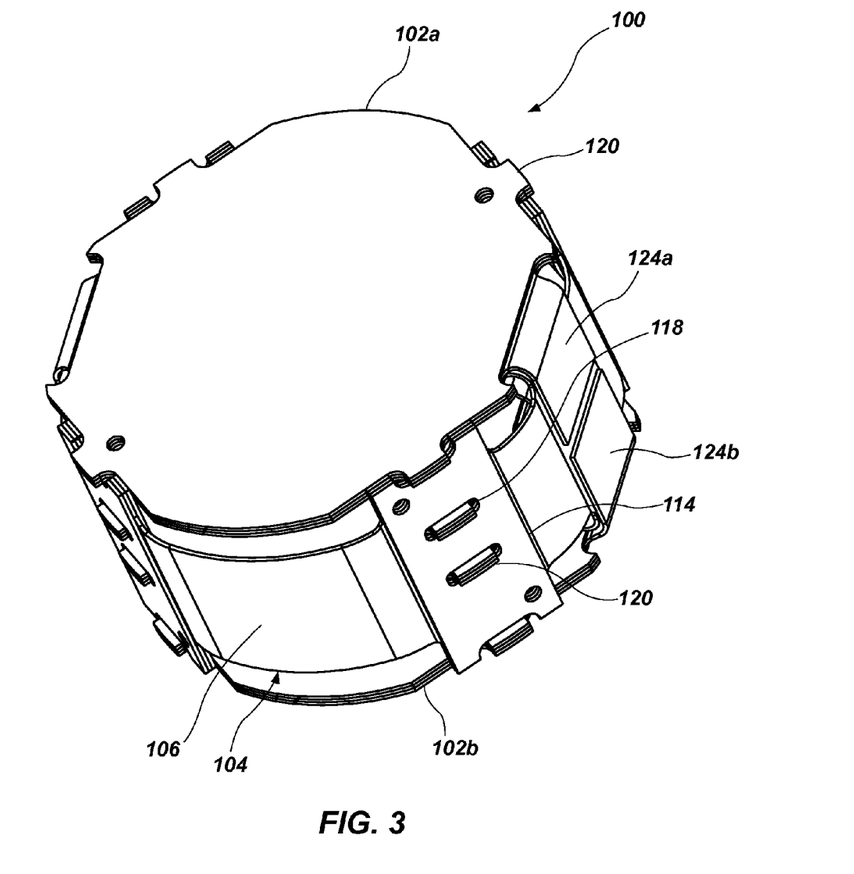
FIG. 3 is a perspective view of the embodiment of an electronics package of the present disclosure of FIG. 1, but without electronic components illustrated thereon.
Figure 4:
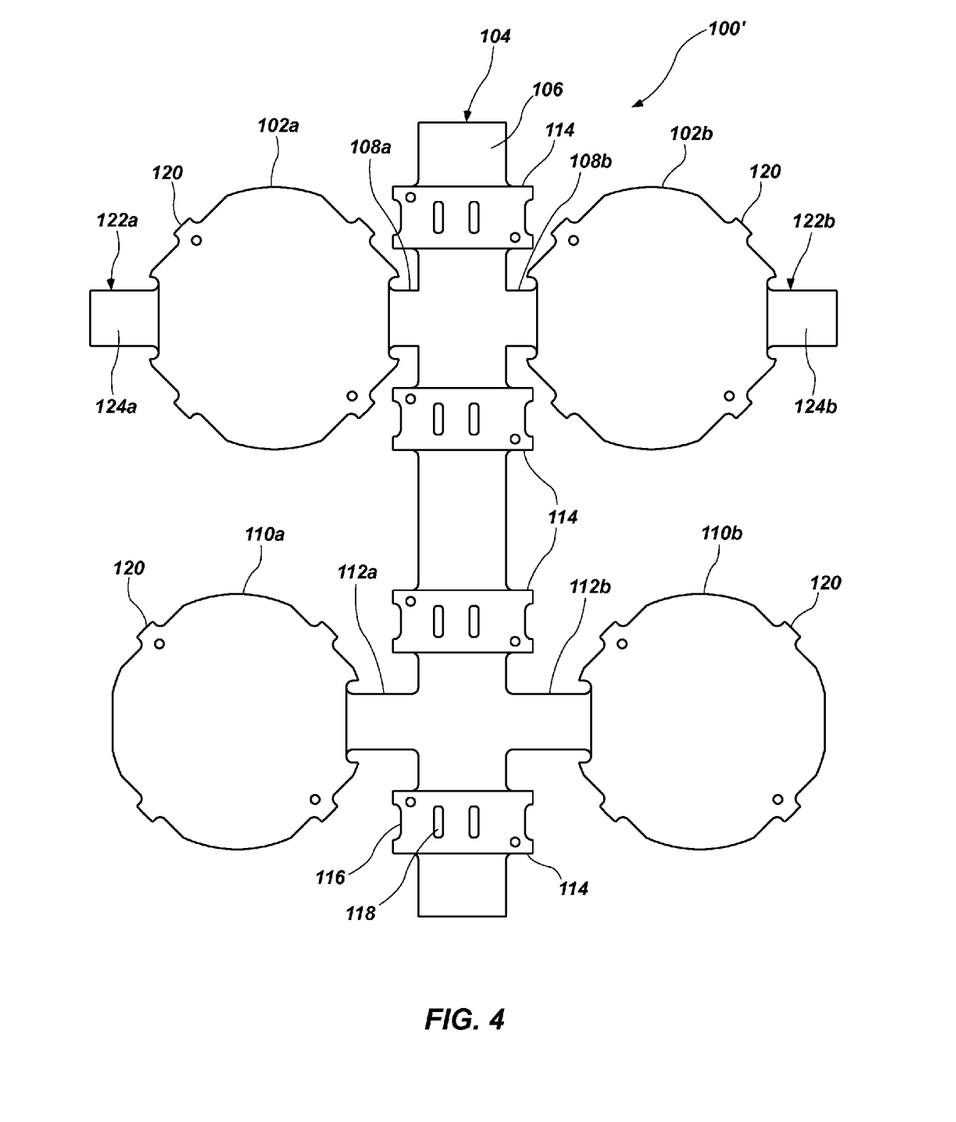
FIG. 4 is a plan view of elements of the precursor structure of the electronics package of the present disclosure without electronic components prior to configuration as the electronics package of FIG. 3.
Figure 5A:
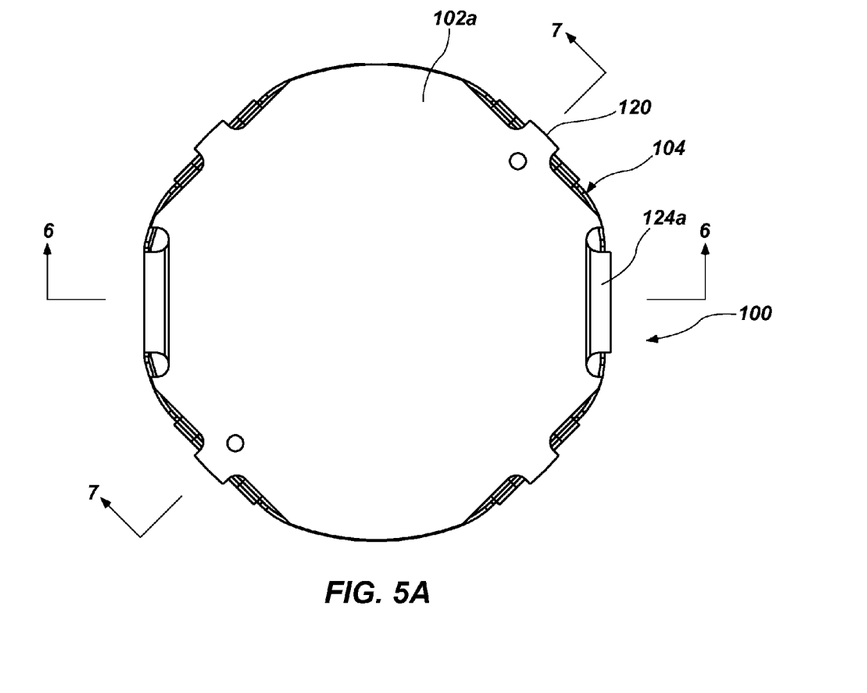
FIG. 5A is a top elevation of the embodiment of FIG. 3.
Figure 5B:
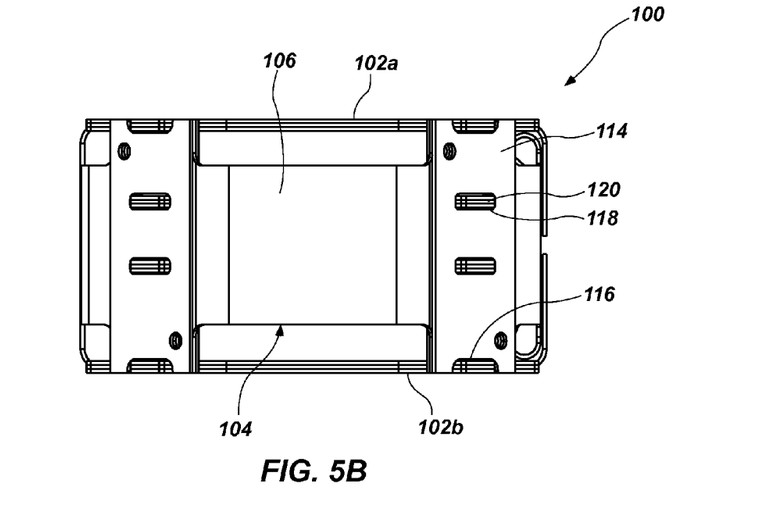
FIG. 5B is a first side elevation of the embodiment of FIG. 3.
Figure 5C:
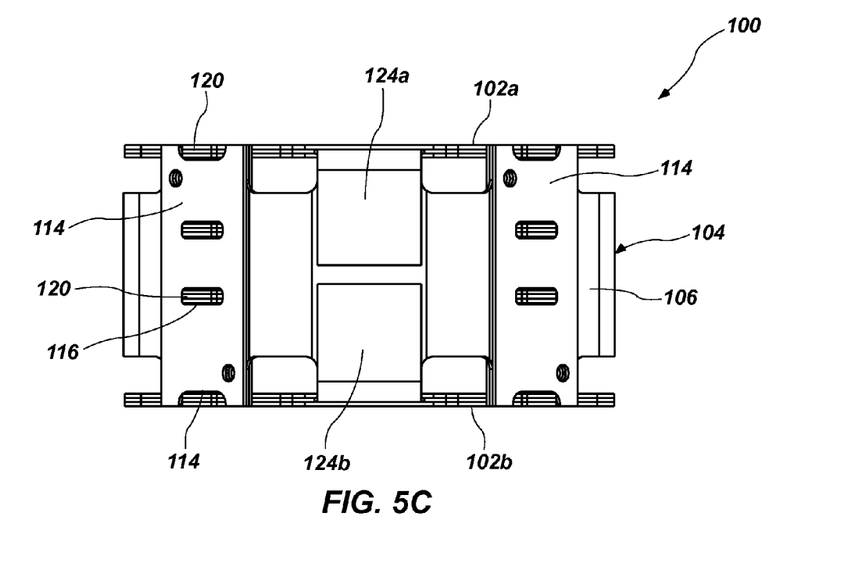
FIG. 5C is a second side elevation of the embodiment of FIG. 3, rotated 90° from FIG. 5B.

More specifically, and with particular reference to FIGS. 2 through 4, electronics package precursor structure 100' comprises first and second outer, generally circular circuit boards 102a and 102b mechanically and electrically connected to linear branches 108a and 108b extending perpendicularly from linear trunk 106 of flex circuit 104. First and second inner, generally circular circuit boards 110a and 110b are mechanically and electrically connected to linear branches 112a and 112b extending perpendicularly from trunk 106 of flex circuit 104 and longitudinally offset down trunk 106 from branches 108a and 108b. Four substantially rigid baffles 114 of equal length are secured to trunk 106 of flex circuit 104 at equally spaced intervals, and are oriented perpendicular to trunk 106 and parallel to branches 108a, 108b, 112a and 112b. Each baffle 114 includes a recess 116 at each end, and two spaced slots 118 between the ends. Recesses 116 of each baffle 114 are longitudinally aligned in a direction parallel to trunk 106 with similarly located recesses of the other baffles 114, and slots 118 are likewise longitudinally aligned in a direction parallel to trunk 106 with similarly located slots 118 of the other baffles 114.

Circuit boards 102a, 102b, 110a and 110b are of substantially the same dimensions and configuration, with each circuit board 102a, 102b, 110a and 110b having four circumferentially spaced tabs 120 extending laterally (e.g., radially) therefrom in a major plane of a respective circuit board 102a, 102b, 110a and 110b from which such tabs 120 extend. One or more of circuit boards 102a, 102b, 110a and 110b may have electronic components mounted thereto on one of both sides, and outer circuit boards 110a, 110b may or may not have electronic components exposed on their outer surfaces when electronics package 100 is in an assembled state. As used herein, the term "generally circular circuit board" means and includes not only circular circuit boards, but circuit boards of a shape approximating a circle such as polygonal boards (i.e., hexagon, octagon) as well as other circuit board shapes such as, for example, ellipses and ovals.

Tabs 120 are spaced circumferentially about each respective circuit board 102a, 102b, 110a and 110b a distance substantially equal to spacing between aligned recesses 116 and aligned slots 118, as taken in a direction parallel to trunk 106, the reason for such relationship being described in more detail below with respect to assembly of electronics package 100.

Figure 6:
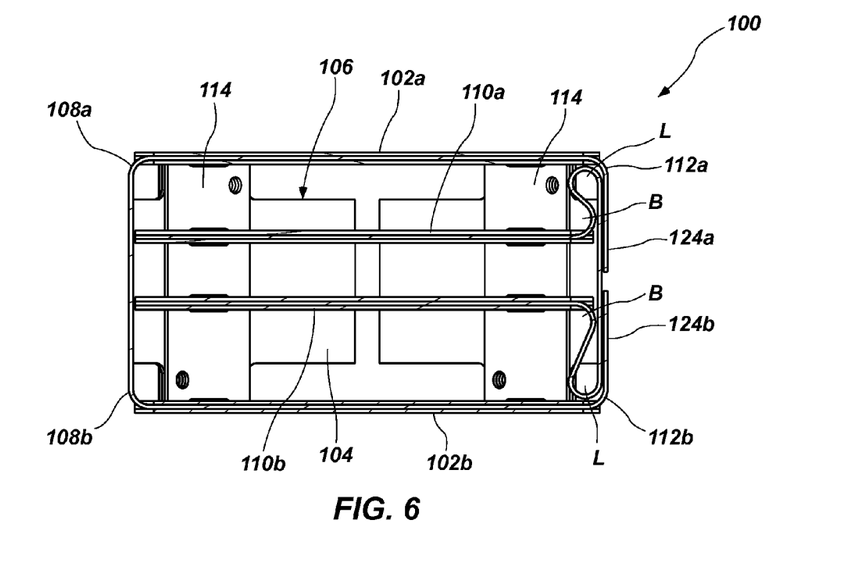
FIG. 6 is a cross-section of the electronics package of FIG. 3, taken through line 6-6 of FIG. 5A.
Figure 7:
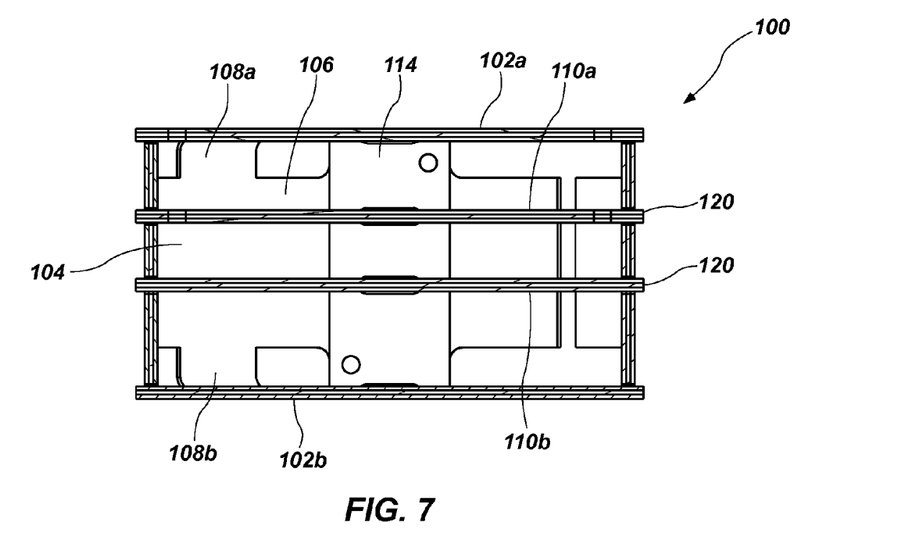
FIG. 7 is a cross-section of the electronics package of FIG. 3, taken through line 7-7 of FIG. 5A.

When in an assembled state, as depicted in FIGS. 1, 3 and 5A through 7, electronics package 100 is configured as a stack of vertically spaced, mutually parallel circuit boards, comprising from top to bottom (such terms being used arbitrarily for the sake of convenience of description) circuit board 102a, circuit board 110a, circuit board 110b and circuit board 102b. The tabs 120 of outer circuit boards 102a and 102b are received in recesses 116 of baffles 114, and the tabs 120 of inner circuit boards 110a and 110b are received in slots 118 of baffles 114, baffles 114 being spaced around a circumference of assembled electronics package 100 at 90° intervals and oriented perpendicular to circuit boards 110a, 102a, 102b and 110b. Trunk 106 of flex circuit 104 wraps circumferentially about electronics package 100 in a direction parallel to circuit boards 110a, 102a, 102b and 110b. At one side of electronics package 100, branches 112a and 112b of flex circuit 104 respectively bend from adjacent trunk 106 upward and downward perpendicularly to form a loop L inward of the circumference of electronics package 100, reverse direction and then bend at B to extend into the plane of inner circuit boards 110a and 110b to which they are respectively attached. On a diametrically opposed side of electronics package 100, branches 108a and 108b of flex circuit 104 bend from adjacent trunk 106 perpendicularly into the plane of outer circuit boards 102a and 102b to which they are respectively attached. Extensions 122a and 122b of branches 108a and 108b comprise flex tabs 124a and 124b (FIG. 4) on an opposing side of each outer circuit board 102a and 102b from a connection of a respective branch 108a and 108b to trunk 106 wrap toward each other and may be adhesively bonded to an exterior surface of trunk 106 of flex circuit 104, taped together, or otherwise mutually secured. At least one of the circuit boards may comprise a laminate, and the flex circuit branch connected thereto may extend between members of the laminate circuit board (FIGS. 6 and 7). Electronics package 100 may, in its configured state, be characterized in shape as a generally right circular cylinder. Connections to external circuitry may be effected from outer circuit boards 102a or 102b, and, if desired, one or both extensions 122a and 122b may be elongated for connection at ends thereof, as is known in the flex circuit art to those of ordinary skill. The manner of effecting external electrical connections is by way of illustration and not limitation.

To assemble electronics package 100 from electronics package precursor structure 100', inner circuit boards 110a and 110b, with reference to FIG. 4, are folded upward toward one another and perpendicular to the plane of trunk 106 of flex circuit 104, tabs 120 inserted into slots 118 of the lowermost two baffles 114 as branches 112a and 112b flex to form loops L and bends B (FIG. 6), and then rotated (e.g., rolled) upward to engage slots 118 of each of the uppermost two baffles 114 and to align with branches 108a and 108b, outer circuit boards 102a and 102b then being folded upward on opposing sides of inner circuit boards 110a and 110b to engage recesses 116 on the ends of all four baffles 114 with their respective tabs 120, all circuit boards 102a, 102b, 110a and 110b then being aligned and in mutually parallel relationship. Flex tabs 124a and 124b of extensions 122a and 122b are then secured as described above. Optionally, a length of shrink fit tubing may be applied around electronics package 100 and heated to shrink about electronics package 100 to insulate the electronics package 100 from a housing that may receive it or to firm up the assembly. Optionally, in lieu of employing shrink fit tubing, the assembly comprising electronics package 100 may be potted in a dielectric material to harden the electronics, such a technique being known to those of ordinary skill in the art.

The electronics package of the present disclosure may be adaptable to miniaturization, and in one embodiment component parts thereof may be fabricated and assembled into a package smaller than one cubic inch, although the present disclosure is not limited by package dimensions. In some embodiments and without limitation, the electronics package may be employed, with appropriate active and passive electronic components, in a warhead of a self-propelled projectile such as may be employed in defense of an aerospace vehicle against airborne threats. In other embodiments, the electronics package may find application to general purpose, miniaturized electronics packaging.

The present disclosure may, in some embodiments, employ conventional printed circuit board (also known as printed wiring board) and flex circuit technology with self-locating features to provide structural stability and high density packaging. Such an approach provides a relatively low cost solution for high density electronics packaging, and eliminates the need for mechanical components for board spacing, as well as housings.

While particular embodiments of the disclosure have been shown and described, numerous variations and alternate embodiments encompassed by the present disclosure will occur to those skilled in the art. Accordingly, the invention is only limited in scope by the appended claims and their legal equivalents.

What is claimed is:

1. An electronics package, comprising: a number of mutually parallel, vertically spaced circuit boards; and a flex circuit comprising a trunk extending circumferentially and including a same number of branches as the number of circuit boards, each branch mechanically and electrically connected to one of the number of circuit boards, further comprising baffles equally spaced along the trunk of the flex circuit, secured to and extending perpendicular to the trunk, each baffle engaged with each circuit board of the number of circuit boards, wherein each circuit board comprises a number of equally circumferentially spaced tabs laterally extending in a major plane of the circuit board, each tab of an outer circuit board engaged with a recess proximate an outer end of a baffle and each tab of an inner circuit board engaged with a slot in a baffle.

2. The electronics package of claim 1, wherein the circuit boards are each generally circular in shape, and the electronics package generally comprises a right circular cylinder.

3. The electronics package of claim 2, wherein the branches extend perpendicularly from the trunk, two opposing branches each connected to an inner circuit board of the number of circuit boards, and two other opposing branches spaced from the two branches along the trunk and each of the two other branches connected to an outer circuit board of the number of circuit boards.

4. The electronics package of claim 3, wherein the branches of the flex circuit extend inwardly of an outer boundary of the circuit board to which a respective branch is connected.

5. The electronics package of claim 4, wherein each branch connected to an outer circuit board extends across a diameter of the circuit board to which such respective branch is connected and further comprises a tab folded over the trunk of the flex circuit at a location diametrically opposed to a location of extension from the trunk of the flex circuit.

6. The electronics package of claim 4, wherein at least one circuit board comprises a laminate and a branch of the flex circuit connected to the at least one laminate circuit board extends between two members of the at least one laminate circuit board.

7. The electronics package of claim 1, wherein the number of circuit boards is four.

8. The electronics package of claim 7, wherein the number of baffles is four.

9. The electronics package of claim 1, wherein the baffles are spaced at 90° circumferential intervals.

10. The electronics package of claim 9, wherein the two opposing branches each connected to an inner circuit board extend from the trunk of the flex circuit on one side of the electronics package and the two opposing branches each connected to an outer circuit board extend from the trunk of the flex circuit on a diametrically opposing side of the electronics package.

11. The electronics package of claim 1, further comprising electronic components on at least some boards of the number of boards.

12. An electronics package precursor structure, comprising: a flex circuit including a linear trunk, a first pair of opposing branches extending perpendicular to the trunk, each branch of the first pair mechanically and electrically connected to a generally circular circuit board and a second pair of opposing branches extending perpendicular to the trunk, each branch of the second pair mechanically and electrically connected to a generally circular circuit board, wherein the branches of the second pair are longer than the branches of the first pair, and further comprising four equally spaced baffles oriented perpendicular to and secured to the trunk of the flex circuit, two baffles being equally longitudinally spaced on opposing sides of the first pair of branches and two baffles being equally longitudinally spaced on opposing sides of the second pair of branches.

13. The electronics package precursor structure of claim 12, wherein each baffle comprises a recess proximate each end thereof and two spaced slots between the ends, and each circuit board comprises four tabs extending laterally in a major plane thereof and spaced circumferentially at 90° intervals.

14. The electronics package precursor structure of claim 12, further comprising electronic components on at least some of the circuit boards.

15. A method of producing an electronics package, the method comprising:
 providing a substantially planar assembly comprising a flex circuit including a linear trunk, a first pair of opposing branches extending perpendicular to the trunk, each branch of the first pair mechanically and electrically connected to a generally circular circuit board and a second pair of opposing branches extending perpendicular to the trunk, each branch of the second pair mechanically and electrically connected to a generally circular circuit board;
 moving circuit boards connected to the first pair of branches toward one another to a position perpendicular to the plane of the assembly and rotating the circuit boards connected to the first pair of branches along an axis of the linear trunk to a position between the second pair of branches; and
 moving circuit boards connected to the second pair of branches toward one another to a position perpendicular to the plane of the assembly and on opposing sides of the circuit boards connected to the first pair of branches to place all of the circuit boards in aligned, mutually parallel relationship.

16. The method of claim 15, further comprising engaging each of the circuit boards with baffles spaced along and connected to the trunk of the flex circuit to maintain all of the circuit boards in the aligned, mutually parallel relationship.

* * * * *